(12) United States Patent
Chen

(10) Patent No.: US 7,667,557 B2
(45) Date of Patent: *Feb. 23, 2010

(54) THIN-FILM BANDPASS FILTER USING INDUCTOR-CAPACITOR RESONATORS

(75) Inventor: Qiang Richard Chen, Phoenix, AZ (US)

(73) Assignee: TDK Corporation, Tokyo (JP)

( * ) Notice: Subject to any disclaimer, the term of this patent is extended or adjusted under 35 U.S.C. 154(b) by 213 days.

This patent is subject to a terminal disclaimer.

(21) Appl. No.: 11/408,412

(22) Filed: Apr. 21, 2006

(65) Prior Publication Data

US 2007/0126529 A1 Jun. 7, 2007

Related U.S. Application Data

(60) Provisional application No. 60/748,045, filed on Dec. 6, 2005.

(51) Int. Cl.
*H03H 7/00* (2006.01)
(52) U.S. Cl. .................. 333/185; 333/175; 333/204
(58) Field of Classification Search .......... 333/175, 333/184, 185, 204, 205
See application file for complete search history.

(56) References Cited

U.S. PATENT DOCUMENTS

| 4,888,568 A | * | 12/1989 | Kawaguchi | ........... 333/174 |
|---|---|---|---|---|
| 5,175,518 A | * | 12/1992 | Swanson, Jr. | ........... 333/168 |
| 5,525,942 A | * | 6/1996 | Horii et al. | ........... 333/134 |
| 6,577,208 B2 | * | 6/2003 | Kushitani et al. | ........... 333/174 |
| 6,590,473 B1 | * | 7/2003 | Seo et al. | ........... 333/185 |
| 7,321,284 B2 | * | 1/2008 | Chen et al. | ........... 336/200 |
| 2004/0207487 A1 | * | 10/2004 | Hayashi | ........... 333/185 |
| 2006/0077020 A1 | * | 4/2006 | Wang et al. | ........... 333/204 |

FOREIGN PATENT DOCUMENTS

| EP | 0608815 | 8/1994 |
|---|---|---|
| EP | 1050960 | 11/2000 |
| EP | 1067618 | 1/2001 |
| GB | 2383702 | 7/2003 |
| JP | 4150011 | 5/1992 |
| JP | 10209710 | 8/1998 |

* cited by examiner

*Primary Examiner*—Robert Pascal
*Assistant Examiner*—Kimberly E Glenn
(74) *Attorney, Agent, or Firm*—Allen J. Moss; Alex Starkovich; Squire, Sanders & Dempsey L.L.P.

(57) ABSTRACT

A bandpass filter including one or more metal layers, each layer having a first region and a second region. The filter also includes two or more LC resonators and one or more coupling networks for connecting the two or more LC resonators in parallel. The two or more LC resonators are contained within the first region of the one or more layers and the one or more coupling networks are contained in the second region of the one or more layers.

10 Claims, 17 Drawing Sheets

9. ADD PASSIVATION LAYER — S909

10. ADD SIDE WALL TERMINATIONS — S910

THIN-FILM BANDPASS FILTER USING INDUCTOR-CAPACITOR RESONATORS

CROSS-RELATED APPLICATIONS

This application claims the benefit of Provisional Patent Application No. 60/748,045 by Richard Chen filed on Dec. 6, 2005 and titled "Bandpass Filter" which is hereby incorporated by reference herein.

DESCRIPTION OF THE INVENTION

1. Field of the Invention

The present invention relates to a bandpass filter, and more specifically to a thin-film bandpass filter.

2. Background of the Invention

In recent years, marked advances in the miniaturization of mobile communication terminals, such as mobile phones and Wireless LAN (Local Area Network) routers, has been achieved due to the miniaturization of the various components incorporated therein. One of the most important components incorporated in a communication terminal is the filter.

In particular, bandpass filters are often used in communication applications for blocking or filtering signals with frequencies outside a certain passband. For example, Bluetooth and Wireless Local Area Network (WLAN) use the 2.4 GHz band for data communication. Nearby frequency bands used for other communication systems include GSM-900 (880-960 MHz), GSM-1800 (1710-1990 MHz, also called PCS in Hong Kong and United Kingdom) and WCDMA (2110-2170 MHz). Filters for 2.4 GHz band preferably reject these nearby bands so that frequency interference can be minimized. Since these nearby bands are all lower and close to 2.4 GHz in frequency, consequently a 2.4 GHz filter preferably has higher skirt selectivity at the lower pass-band edge.

In general, bandpass filters preferably exhibit low insertion loss and steep roll-off attenuation at passband edges (i.e., the upper and lower frequencies of the range that are not highly attenuated by the filter). Out-band rejection or attenuation is an important parameter for a bandpass filter. It measures the filter's capability of discriminating in-band and out-band signals. The bigger the out-band rejection and the wider the rejected bandwidth, normally the better the filter. Also, the steeper the rolloff frequency edge between pass-band and out-band, the better the filter. To achieve rapid rolloff, higher resonator Q and more resonant circuits (i.e. more filter sections) are typically required. This generates more transmission zeros at out-bands, leading to higher order of out-band attenuation. Unfortunately, using more sections and resonant circuits increases filter dimensions and a filter's insertion loss in the pass-band. This is not helpful for the miniature requirement in modem wireless communication systems.

For example, conventionally, low-loss high quality factor microwave resonator circuits are used to achieve steep roll-off attenuation. Microwave resonator circuits typically utilize quarter-wavelength or half-wavelength transmission line structures in order to realize low losses at microwave frequency. For lower gigahertz wireless applications, quarter-wave or half-wavelength structures demand large component size in order to accommodate the transmission line structures. Such large components are typically unsatisfactory for use in smaller electronic devices, such as those requiring a 1 mm long by 0.5 mm wide by 0.3 mm thick circuit size.

SUMMARY OF THE INVENTION

In view of the foregoing, the invention provides a band pass filter in which inductor-capacitor (LC) resonators are constructed in one region of the filter and a coupling network is constructed in another region of the filter. In this way, a higher quality bandpass filter may be constructed in a smaller size and in as few as two thin-film metal layers.

According to one embodiment of the invention, a bandpass filter includes one or more metal layers, each metal layer having a first region and a second region. The filter also includes two or more LC resonators and one or more coupling networks for connecting the two or more LC resonators in parallel. The two or more LC resonators are contained within the first region of the one or more metal layers and the one or more coupling networks are contained in the second region of the one or more metal layers.

This filter structure may be arranged in a manner so that only two thin-film metal layers are used, though more than two metal layers may be employed. As such, this filter may be constructed in a smaller size. In addition, by positioning the resonators in a region of the filter apart from the coupling network, additional metal layers for counteracting metal-to-metal crossover are not as needed. That is, since the coupling network is in a region other than the resonators (in all metal layers), little to no metal overlap between the resonators and the coupling network exists. As such, there is a much lower need to construct an additional metal layer to compensate for metal overlap. Such, overlap generally deteriorates the quality factor (Q) of the resonator inductor.

According to another aspect of the invention, a capacitor used in the LC resonator is positioned in the natural coiling (rotating) direction of an inductor of the LC resonator.

According to another aspect of the invention, the bandpass filter includes three LC resonators.

According to another aspect of the invention, the inductors in each of the LC resonators are positioned in the same coiling (rotating) direction.

According to another aspect of the invention, a thinner filter thickness may be achieved by using a thin-film process on one side of a substrate. In addition, the substrate may be generally thinner since it functions mostly as an insulated carrier.

It is to be understood that the descriptions of this invention herein are exemplary and explanatory only and are not restrictive of the invention as claimed.

DESCRIPTION OF THE EMBODIMENTS

Reference will now be made in detail to the present exemplary embodiments of the invention, examples of which are illustrated in the accompanying drawings.

The present invention relates to a bandpass filter, and more specifically to a thin-film bandpass filter. In particular, the bandpass filter of this invention may be adapted for use in Bluetooth 2.4 GHz applications and other lower GHz applications.

According to one embodiment, the bandpass filter includes one or more metal layers, each metal layer having a first region and a second region. The filter also includes two or more LC resonators and one or more coupling networks for connecting the two or more LC resonators in parallel. The two or more LC resonators are contained within the first region of the one or more metal layers and the one or more coupling networks are contained in the second region of the one or more metal layers.

Figure 1:
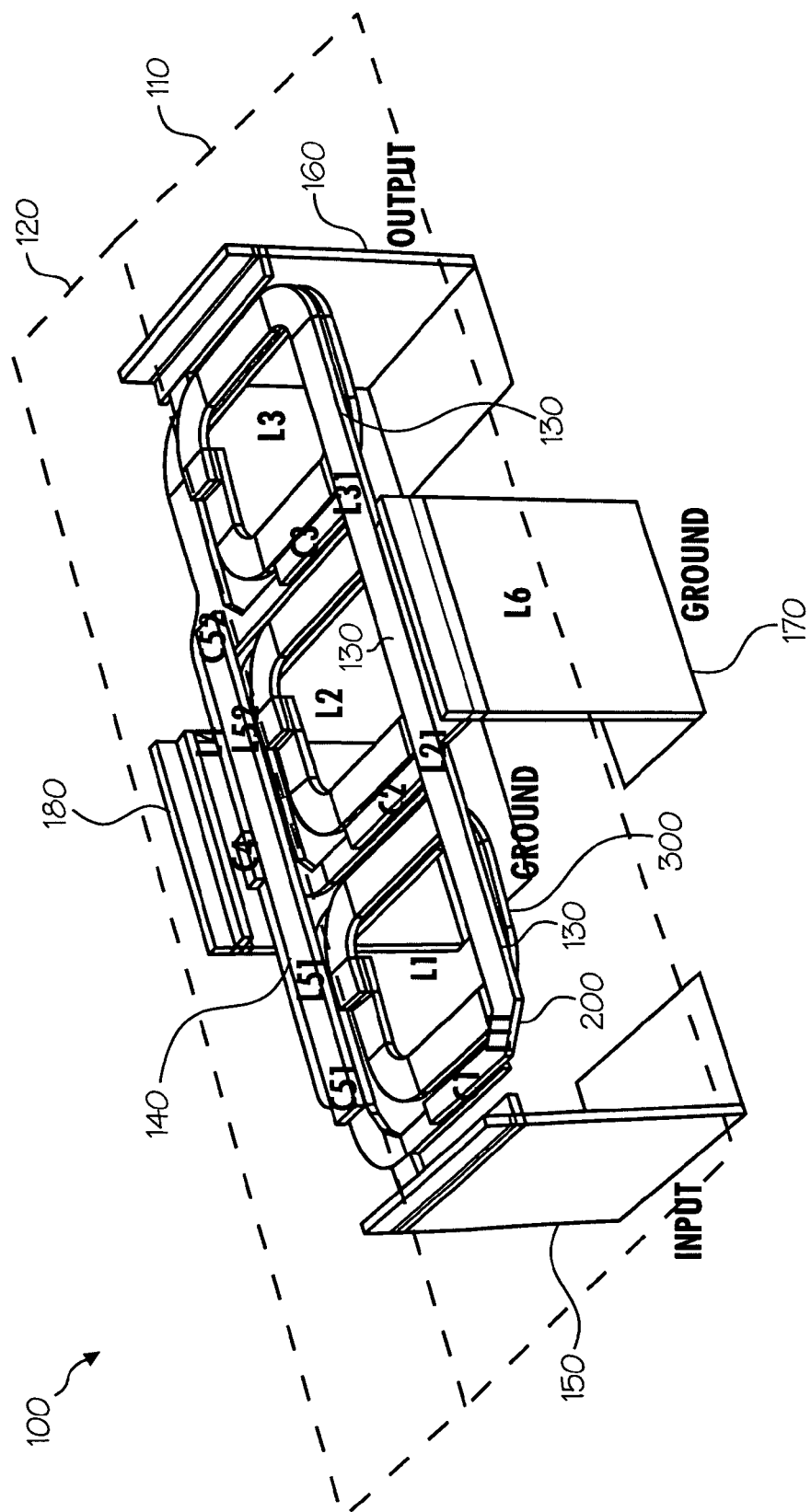
FIG. 1 depicts an isometric view of a physical layout of a bandpass filter according to one embodiment of the invention.

FIG. 1 depicts an isometric view of a physical layout of a bandpass filter according to one embodiment of the invention. Bandpass filter 100 includes inductor-capacitor ("LC") resonators 130 and a coupling network 140. As shown in FIG. 1, there are three LC resonators employed. However, two or more resonators may be used depending on the application and frequency response desired. As shown in FIG. 1, both the resonators 130 and the coupling network 140 are preferably constructed in two metal layers; a first metal layer 200 and a second metal layer 300. The invention is not limited to a filter structure with two metal layers. More metal layers may be used as desired for certain application. In particular, more metal layers may be used for applications which have more than three resonators and consequently more complex coupling networks.

LC resonators 130 are contained in a first region 110 of the filter package and coupling network 140 is contained in a second region 120 of the filter package. The package may also include in input terminal 150, output terminal 160, and ground terminals 170 and 180. As shown in FIG. 1, both metal layers of the coupling network are constructed in a region that is separate from another region in which both metal layers of the resonators are constructed. By using this arrangement, the invention 1) enables inductor and capacitor as resonator components to have the flexibility to be implemented on both metal layers, 2) helps to avoid metal crossing over resonators (i.e., metal from other non-resonator structures) which may deteriorate resonator Q, and 3) allows for additional inductors to be used (e.g., L51 and L52 in FIG. 1) to adjust filter out-band rejection performance without substantially degrading the performance of the resonators.

Figure 2:
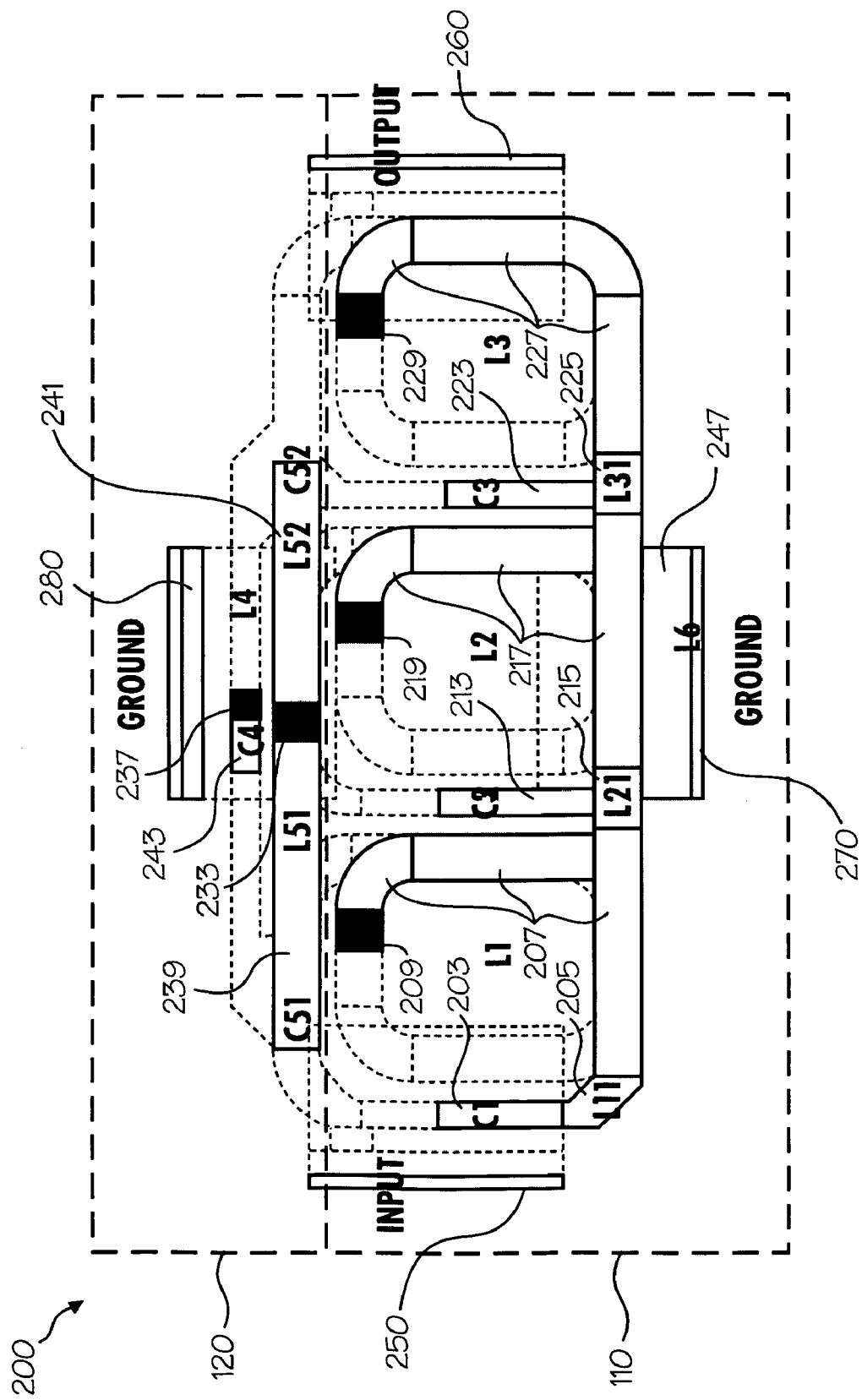
FIG. 2 depicts a physical layout of the top metal layer of the bandpass filter shown in FIG. 1 according to one embodiment of the invention.
Figure 3:
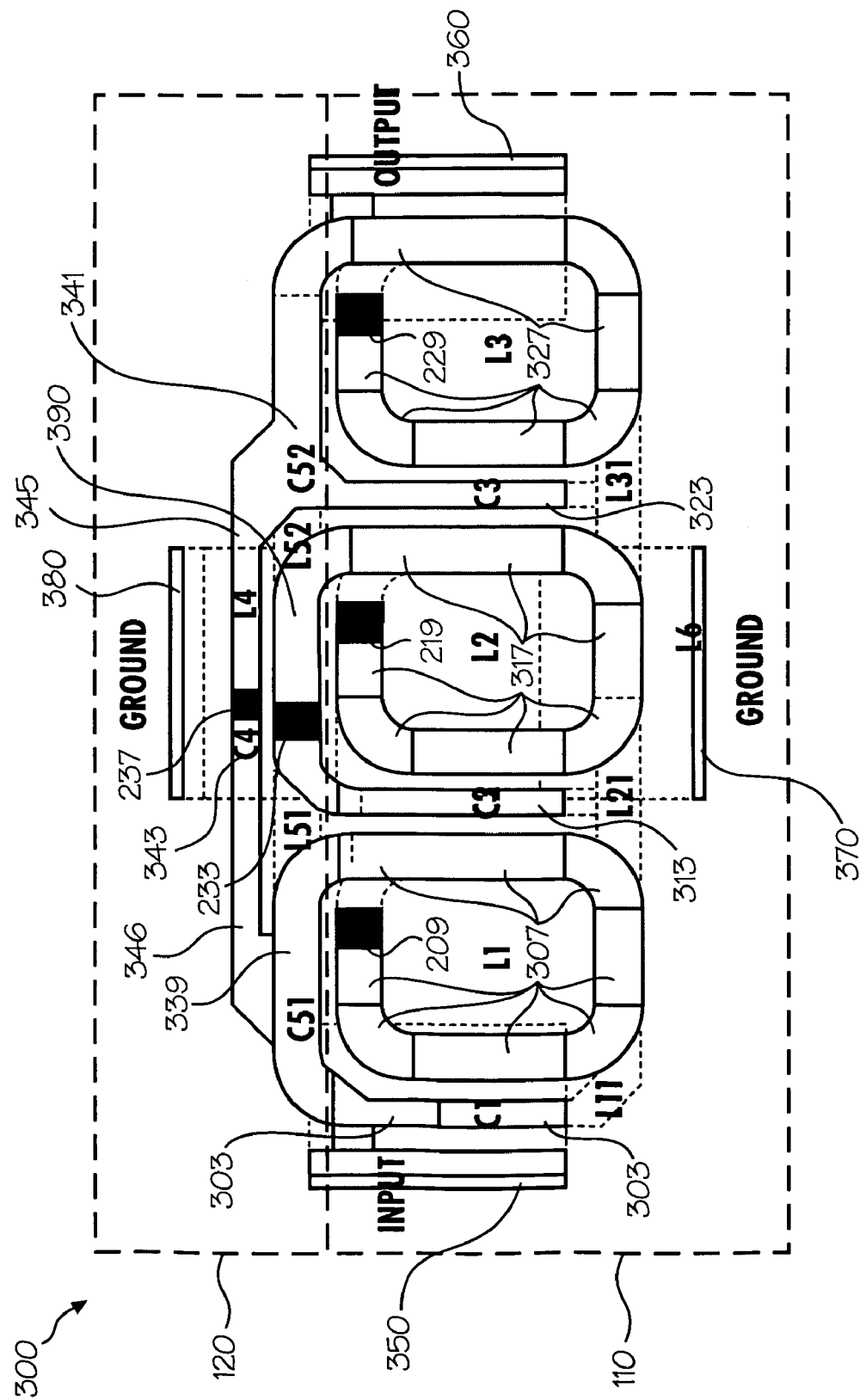
FIG. 3 depicts a physical layout of the bottom metal layer of the bandpass filter shown in FIG. 1 according to one embodiment of the invention.

In the filter layout drawings shown in FIGS. 1 to 3, L1 and C1 form a first resonator 130, L2 and C2 a second resonator 130, and L3 and C3 a third resonator 130. C51 and L51 are the interconnection (coupling) circuit between the first and the second resonators. C52 and L52 are the interconnection (coupling) circuit between the second and third resonators. C4 and L4 are the coupling circuit between filter input 150 and output 160 ports as well as between the first and third resonators. Together the coupling circuits formed by C51 and L51, C52 and L52, and C4 and L4 make up coupling network 140. Such a coupling network may be arranged in any manner possible to produce the desired frequency response characteristics of the bandpass filter. L6 represents a terminal inductance to ground 170.

The layout shown in FIG. 1 is a bandpass filter that is to be constructed in a 1 mm by 0.5 mm form factor with sidewall packaging. However, any size or type of packaging may be used. Preferably, three resonant structures are implemented as shown in FIG. 1. The resonators are constructed as lumped inductor and capacitor resonators. For the same inductance value, a coil inductor occupies less space than that of a piece of transmission line because the magnetic fluxes are shared by every coil turns and consequently, this increases inductance density per area.

FIG. 2 depicts a physical layout of the top layer 200 of the bandpass filter shown in FIG. 1. FIG. 3 depicts a physical layout of the bottom layer 300 of the bandpass filter shown in FIG. 1. It should be noted that the top and bottom layers depicted in FIGS. 2 and 3 may be reversed and/or or laid out in another manner so long as the filter includes two or more LC resonators and one or more coupling networks for connecting the two or more LC resonators in parallel, and the two or more LC resonators are contained within the first region of the one or more metal layers and the one or more coupling networks are contained in the second region of the one or more metal layers.

As shown in FIG. 2, the first (L1, L11, and C1), second (L2, L21, and C2), and third (L3, L31, C3) resonators are partially formed in top layer 200 within region 110. Metal region 203 forms the top plate of a metal-insulator-metal (MIM) capacitor C1. Metal region 203 (C1) is connected to metal regions 207 (L1) via metal region 205 (L11). Metal region 207 (L1) is connected to the remainder of inductor L1 on bottom layer 300 through via 209. Functionally, metal regions 203 and 205 together create an inductor L11 in series with capacitor C1 formed by metal region 203. This series LC circuit (i.e., C1 and L11) is in parallel with inductor L1 to form an LC resonator.

Metal region 207 (L1) is connected to metal region 215 (L21) to connect the first LC resonator (L1, L11, and C1) to the second LC resonator (L2, L21, and C2). Metal region 213 forms the top plate of MIM capacitor C2. Metal region 213 (C2) is connected to metal regions 217 (L2) via metal region 215 (L21). Metal region 217 (L2) is connected to the remainder of inductor L2 on bottom layer 300 through via 219. Functionally, metal regions 213 and 215 together create an inductor L21 in series with capacitor C2 formed by metal region 213. This series LC circuit (i.e., C2 and L21) is in parallel with inductor L2 to form an LC resonator.

Metal region 217 (L2) is connected to metal region 225 (L31) to connect the second LC resonator (L2, L21, and C2)

to the third LC resonator (L3, L31, and C3). Metal region 223 forms the top plate of MIM capacitor C3. Metal region 223 (C3) is connected to metal regions 227 (L3) via metal region 225 (L31). Metal region 227 (L3) is connected to the remainder of inductor L3 on bottom layer 300 through via 229. Functionally, metal regions 223 and 225 together create an inductor L31 in series with capacitor C3 formed by metal region 223. This series LC circuit (i.e., C3 and L31) is in parallel with inductor L3 to form an LC resonator.

Each of the LC resonator circuits are tied to ground 270 (here a sidewall termination) through metal region 247 (L6). Metal region 247 (L6) is connected to metal region 217 (L2) which in turn is connected metal region 207 (L1) and metal region 205 (L11) through metal region 215 (L21). Metal region 247 (L6) is also connected to metal region 227 (L3) and metal region 223 (C3) through metal region 225 (L31).

The coupling network 140 is partially contained in top layer 200 of region 120. Metal region 239 forms both the top plate of MIM capacitor C51 and inductor L51. Likewise metal region 241 forms both the top plate of MIM capacitor C52 and inductor L52. Metal regions 239 and 241 are connected to the remainder of the coupling network on bottom layer 300 through via 233. In addition, metal region 243 forms the top plate of MIM capacitor C4. This capacitor is connected to the remainder of the coupling network on bottom layer 300 through via 237.

Turning now to the bottom layer 300 shown in FIG. 3, metal region 350 (input terminal) is connected to metal region 303 (C1). Metal region 303 forms the bottom plate of MIM capacitor C1. Metal region 303 is connected to metal region 339 which forms the bottom plate of MIM capacitor C51. Note that metal region 303 (C1) is in the first region 110 (as it is part of a resonator) while metal region 339 (C51) is in the second region (as it is part of the coupling network). Metal region 339 (C51) is also connected to metal regions 307 which form the other portion of inductor L1 in bottom layer 300. This portion of inductor L1 is connected to the remainder of the inductor on the upper layer through via 209.

Metal region 313 forms the bottom plate of MIM capacitor C2. Metal region 313 is connected to metal region 390 which in turn connects the second resonator (i.e., L2, L21, and C2) to the coupling network 140 through via 233. Note that metal region 313 (C2) is in the first region 110 (as it is part of a resonator) while metal region 390 is in the second region (as it is part of the coupling network). Metal region 390 is also connected to metal regions 317 which form the other portion of inductor L2 in bottom layer 300. This portion of inductor L2 is connected to the remainder of the inductor on the upper layer through via 219.

Metal region 323 forms the bottom plate of MIM capacitor C3. Metal region 323 is connected to metal region 341 which forms the bottom plate of MIM capacitor C52. Note that metal region 323 (C3) is in the first region 110 (as it is part of a resonator) while metal region 341 (C52) is in the second region (as it is part of the coupling network). Metal region 341 (C52) is also connected to metal regions 327 which form the other portion of inductor L3 in bottom layer 300. This portion of inductor L1 is connected to the remainder of the inductor on the upper layer through via 229. Metal region 327 (L3) is also connected to metal region 360 (output port).

Turning now to the remainder of coupling network 140 contained in region 120, metal region 339 (C51) connects to metal region 346 which forms the lower plate of MIM capacitor C4 and a portion of inductor L4. Metal region 341 (C52) connects to metal region 345 (forms another portion of inductor L4). Metal region 345 then connects to the remainder of the coupling network, specifically metal region 243 (the upper plate of capacitor C4), through via 237.

As shown in FIGS. 1 to 3, the resonator capacitors (i.e., C1, C2, and C3) have been positioned in the natural coiling direction of the inductors to which they are connected (i.e., L1, L2, and L3, respectively). In this case, the natural coiling direction is defined as the direction of signal flow from the top layer to the bottom layer. As such, for the first resonator (L1, L11, and C1), the signal would flow from metal region 203 in a counter-clockwise fashion through metal regions 205 and 207, through via 209, and continuing in a counter-clockwise direction through metal regions 307. As can be seen in FIG. 2 and 3, metal regions 203 and 303 (the plates of capacitor C1) are placed at the beginning and end of a counter-clockwise coil in the same direction as the coil. This arrangement serves to save space and increase resonator Q.

In addition, another aspect of the invention as shown in FIGS. 1 and 3 is that each of the two or more LC resonators used has the same coiling direction. This allows equal spacing between any two neighboring inductors or capacitors and consequently similar amount of mutual coupling are generated between any two neighboring inductors. This helps to generate a balanced and uniform filter structure.

Figure 4:
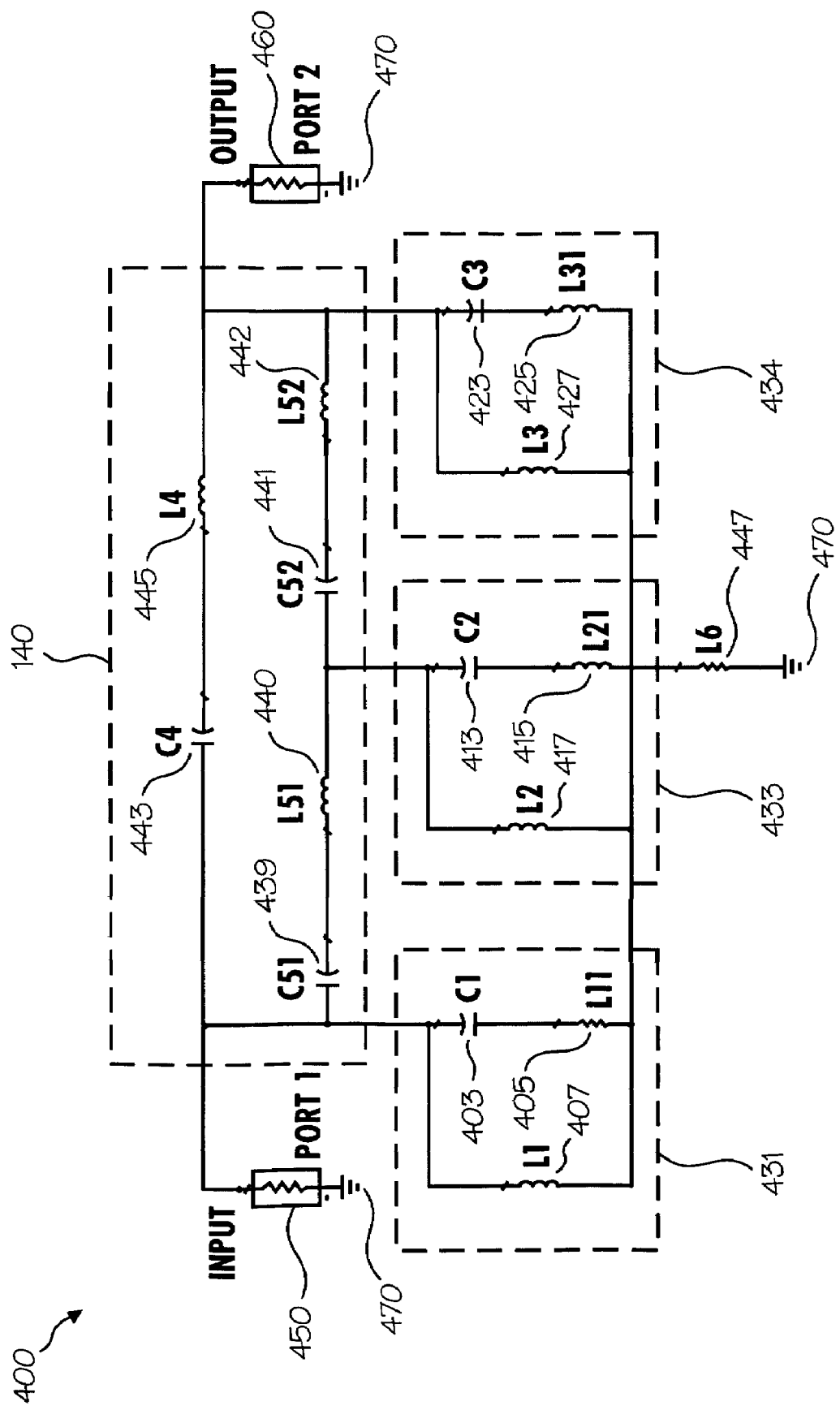
FIG. 4 depicts a schematic of the bandpass filter shown in FIG. 1 according to one embodiment of the invention.

FIG. 4 depicts a schematic of the bandpass filter shown in FIGS. 1 to 3. A first LC resonator 431 includes an inductor 407 (L1) in parallel with an LC series circuit including capacitor 403 (C1) and inductor 405 (L11). LC resonator 431 is connected to ground 470 through inductor 447 (L6). LC resonator 431 is also connected to input port 450. In addition, LC resonator 431 is connected to LC resonator 433 through an LC series circuit that includes capacitor 439 (C51) and inductor 440 (L51).

A second LC resonator 433 includes an inductor 417 (L2) in parallel with an LC series circuit including capacitor 413 (C2) and inductor 415 (L21). LC resonator 433 is connected to ground 470 through inductor 447 (L6). As described above, LC resonator 433 is connected to LC resonator 431 through an LC series circuit that includes capacitor 439 (C51) and inductor 440 (L51). In addition, LC resonator 433 is connected to LC resonator 434 through an LC series circuit that includes capacitor 441 (C52) and inductor 442 (L52).

A third LC resonator 434 includes an inductor 427 (L3) in parallel with an LC series circuit including capacitor 423 (C3) and inductor 425 (L31). LC resonator 434 is connected to ground 470 through inductor 447 (L6). As described above, LC resonator 434 is connected to LC resonator 433 through an LC series circuit that includes capacitor 441 (C52) and inductor 442 (L52). In addition, LC resonator 434 is connected to output port 460.

Finally, LC resonator 431 is connected to LC resonator 434 through an LC series circuit that includes capacitor 443 (C4) and inductor 445 (L4). Likewise, input port 450 is connected to output port 460 through the LC series circuit that includes capacitor 443 (C4) and inductor 445 (L4).

Preferably, the circuit components shown in FIG. 4 have approximately the following values for use in a 2.4 GHz application:

C1=1.8 pF
L11=0.5 nH
L1=1.1 nH
C2=1.8 pF
L21=0.5 nH
L2=1.1 nH
C3=1.8 pF
L31=0.5 nH
L3=1.1 nH
C4=0.2 pF

L4=0.6 nH
C51=0.6 pF
L51=0.3 nH
C52=0.6 pF
L52=0.3 nH
L6=0.15 nH

Please note that these values are merely exemplary. The values of the components in the filter may be changed to any value to suit applications in any passband range.

Figure 5:
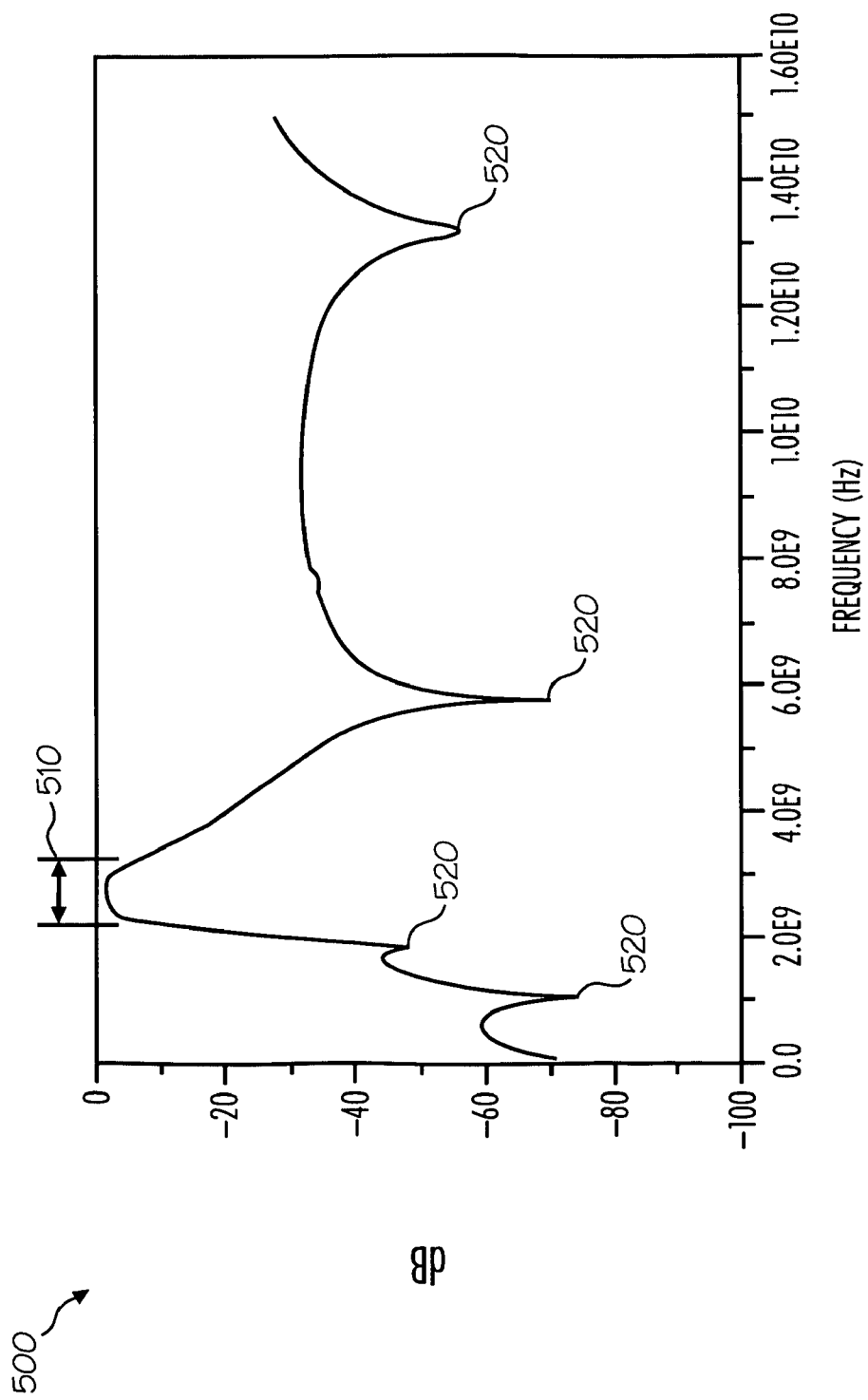
FIG. 5 depicts a frequency response of a bandpass filter according to one embodiment of the invention.

FIG. 5 depicts a frequency response of a bandpass filter with the layout of FIG. 1 to 3 and component values of FIG. 4. In this configuration, frequency response 500 has a passband 510 between approximately 2.3 to 3.0 GHz. Frequency response 500 includes two transmission zeros 520 at the lower side of passband 510 and two transmission zeros 520 at the upper side of passband 510.

The frequency response shown in FIG. 5 is merely exemplary. Different passbands and frequency responses may be achieved by altering the shape, size, and component values of the LC resonators and coupling network. All that is needed is a filter that includes two or more LC resonators and one or more coupling networks for connecting the two or more LC resonators in parallel, wherein the two or more LC resonators are contained within the first region of the one or more layers and the one or more coupling networks are contained in the second region of the one or more metal layers.

Figure 6:
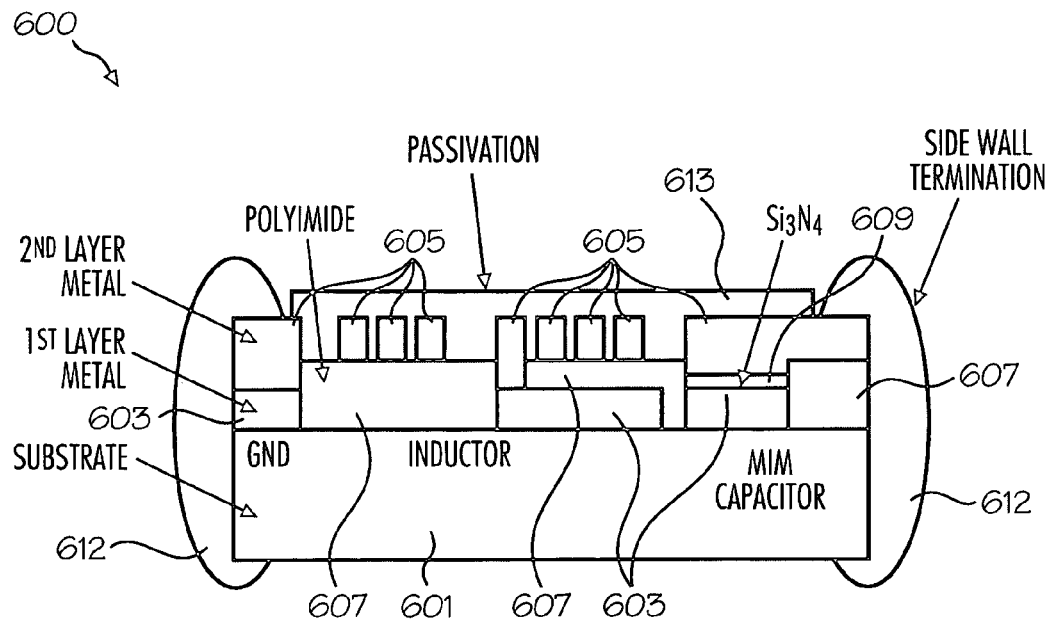
FIG. 6 depicts a cross section of a bandpass filter with inductors on a top metal layer according to one embodiment of the invention.
Figure 7:
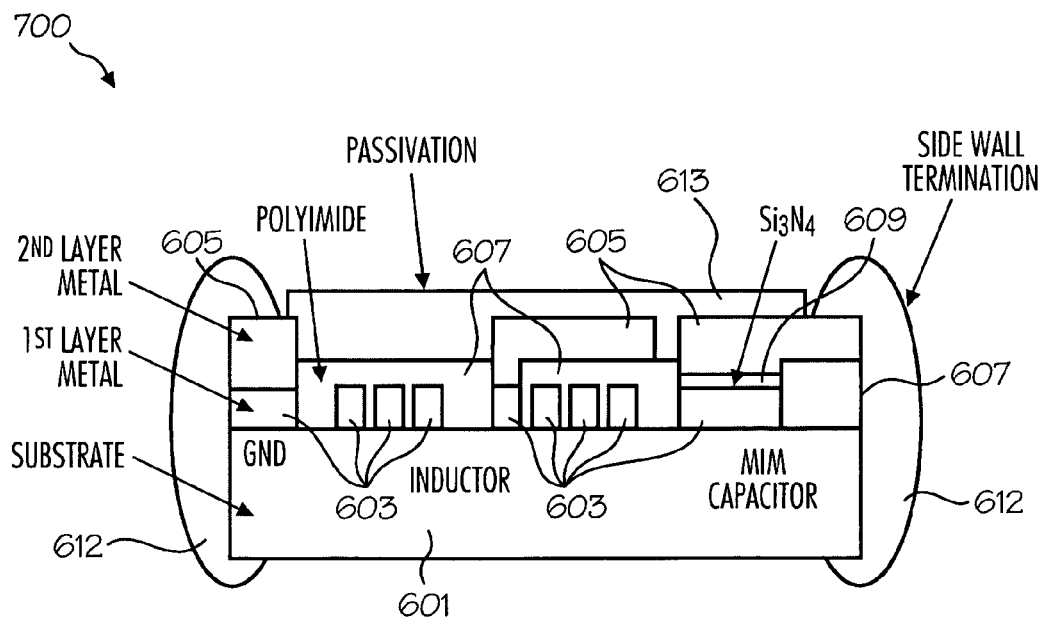
FIG. 7 depicts a cross section of a bandpass filter with inductors on a bottom metal layer according to one embodiment of the invention.

FIGS. 6 and 7 depict cross sections of a bandpass filter formed from microstrip-line structures showing the inductors on a top layer and on a bottom layer, respectively. Bandpass filter structures 600 and 700 include a substrate 601, a first metal layer 603, a second metal layer 605, an insulator layer 607, a capacitor dielectric layer 609, sidewall terminations 612, and passivation layer 613.

The substrate is preferably made of a low dissipation loss material, such as ceramic, sapphire, quartz, gallium arsenide (GaAs), or a high-resistivity silicon, but may be other material such as glass or low-resistivity silicon. The first and second metal layers are preferably made of copper, but may be gold, aluminum or other materials with suitable conductive properties. The insulator is preferably made of polyimide, but may be other material such as silicon oxide, photoresist materials, or other materials with suitable insulative properties. The capacitor dielectric is preferably made of silicon nitride (Si3N4), but may be any type of dielectric useful for making metal-insulator-metal (MIM) capacitors including alumina, silicon oxide, tantalum oxide, etc. Preferably, the passivation layer is made with silicon nitride or aluminum oxide (Al2O3), but may be any material suitable for providing protection to the top of electronic chips. The sidewall terminations may be made from any suitable conductor such as tin, nickel, copper or a nickel/copper/tin sandwich. The sidewall terminations are applied to the sides of the bandpass filter package so that they may be directly bonded to solder pads on a circuit board. This allows the bandpass filter to take up less room within a device.

The metal, insulator, and dielectric layers are preferably applied to the substrate using any conventional thin-film process. Examples of such processes include plating, chemical vapor deposition, plasma-enhanced chemical vapor deposition, thermal evaporation, electron beam evaporator, sputtering, pulsed laser deposition, molecular beam epitaxy, reactive sputtering, chemical etching and dry etching. However, any technique for creating thin-films may be utilized.

Figure 8A:
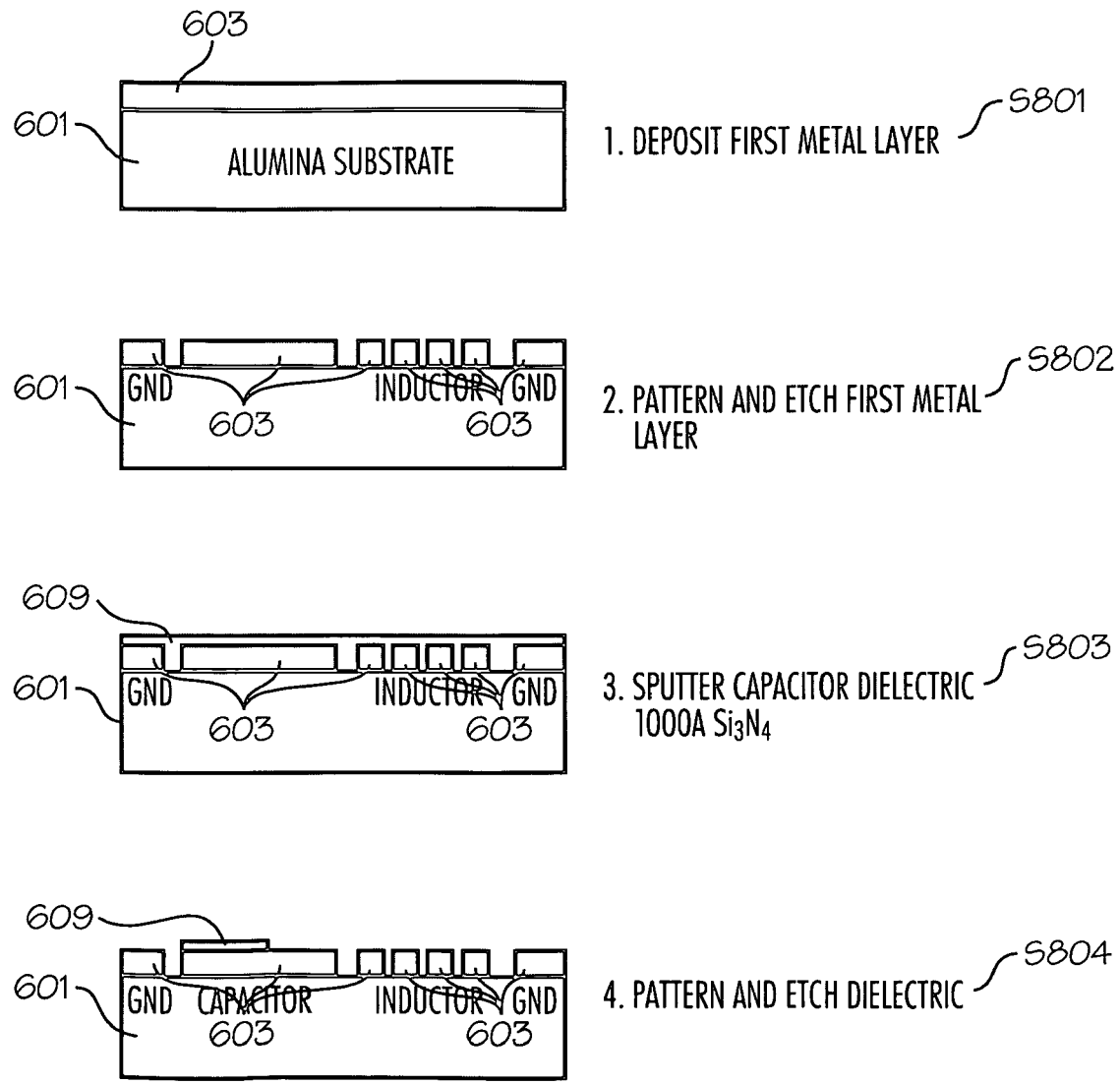
FIGS. 8A, 8B and 8C depict a method for manufacture of a bandpass filter with inductors on a bottom metal layer according to one embodiment of the invention.
Figure 8B:
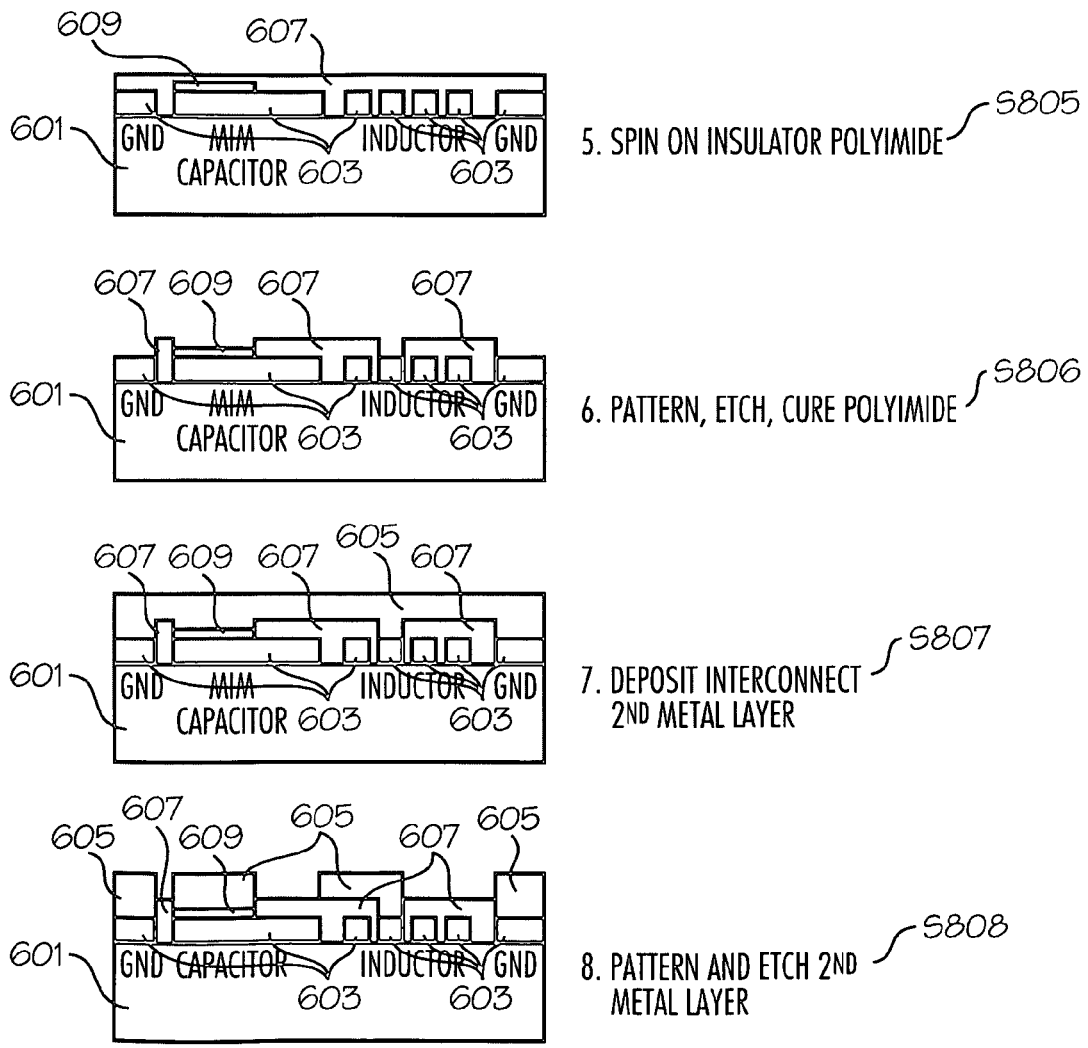
Figure 8C:
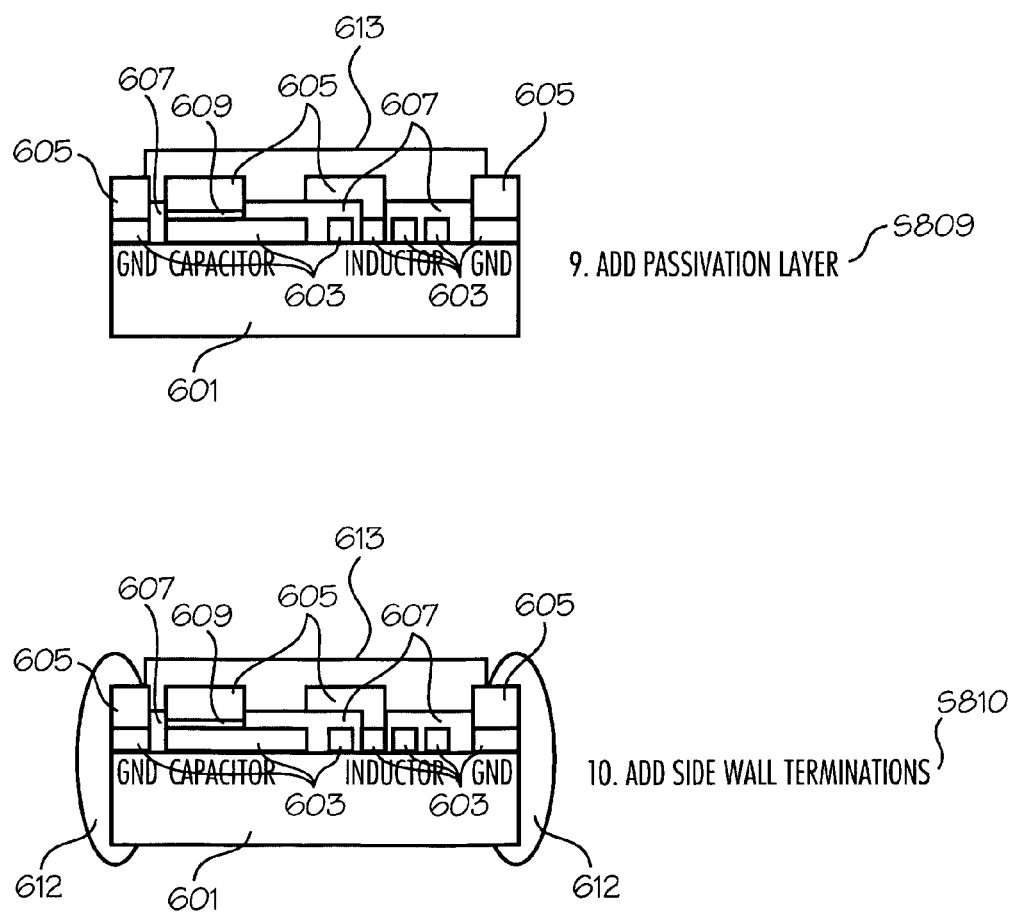

FIGS. 8A-C depict a method for manufacture of a bandpass filter with inductors on a bottom layer according to one embodiment of the invention. As mentioned above, the bandpass filter of the invention is preferably manufactured using thin-film processes. Other processes may be used in situations where very small size is not needed or desired.

Thin-film processes, among other ways, allow for the creation of fine metal patterns, by using photo masks and chemical etching. Compared with low temperature co-fired ceramic processes (LTCC), which normally have a pattern resolution of about 10's of microns, thin-film processes can achieve resolutions at the micron or even the sub-micron level.

Turning now to FIGS. 8A-C and step S801, a first metal layer 603 is deposited on substrate 601. The substrate's starting thickness can be anywhere from 0.5 mm to 5 mm depending on process equipment. Preferably, the finish substrate thickness is 100 to 500 µm after backside process. The metal layer is preferably 1 to 20 µm thick. The metal may be deposited using any thin-film technique but is preferably deposited by sputtering or plating. In step S802, a pattern is applied to the first metal layer and the first metal layer is etched away to form the desired layout. Next, in step S803 the capacitor dielectric 609 is sputtered onto the substrate and first metal layer. Preferably, the dielectric thickness is between 0.06 to 0.3 µm. In step S804, a pattern is placed on the dielectric and it is etched to achieve the desired layout.

Next, in step S805 insulator 607 is spun onto the substrate, first metal layer, and capacitor dielectric. Preferably, the insulator is between 3 to 10 µm thick. In step S806, a pattern is placed on insulator 607 and the insulator is etched away to form the desired layout. Step S806 may also include a process to cure the insulator. Next, in step S807 a second metal layer 605 is deposited on the first metal layer, capacitor dielectric, and insulator. The second metal layer is preferably 1 to 20 µm thick. Then, in step S808 a pattern is placed on second metal layer 605 and the second metal layer is etched away to form the desired pattern. In step S809, the passivation layer 613 is added to the filter. The passivation layer 613 is applied over the second metal layer 605 and insulator 607 at a preferred thickness of 20 µm to 50 µm. Finally, in step S810 sidewall terminations are added to the filter package.

The ranges of thickness described above are not absolute requirements, but merely represent preferred ranges for manufacturing filters that operate in the lower gigahertz range. Larger or smaller thicknesses could be employed for use in other applications.

Figure 9A:
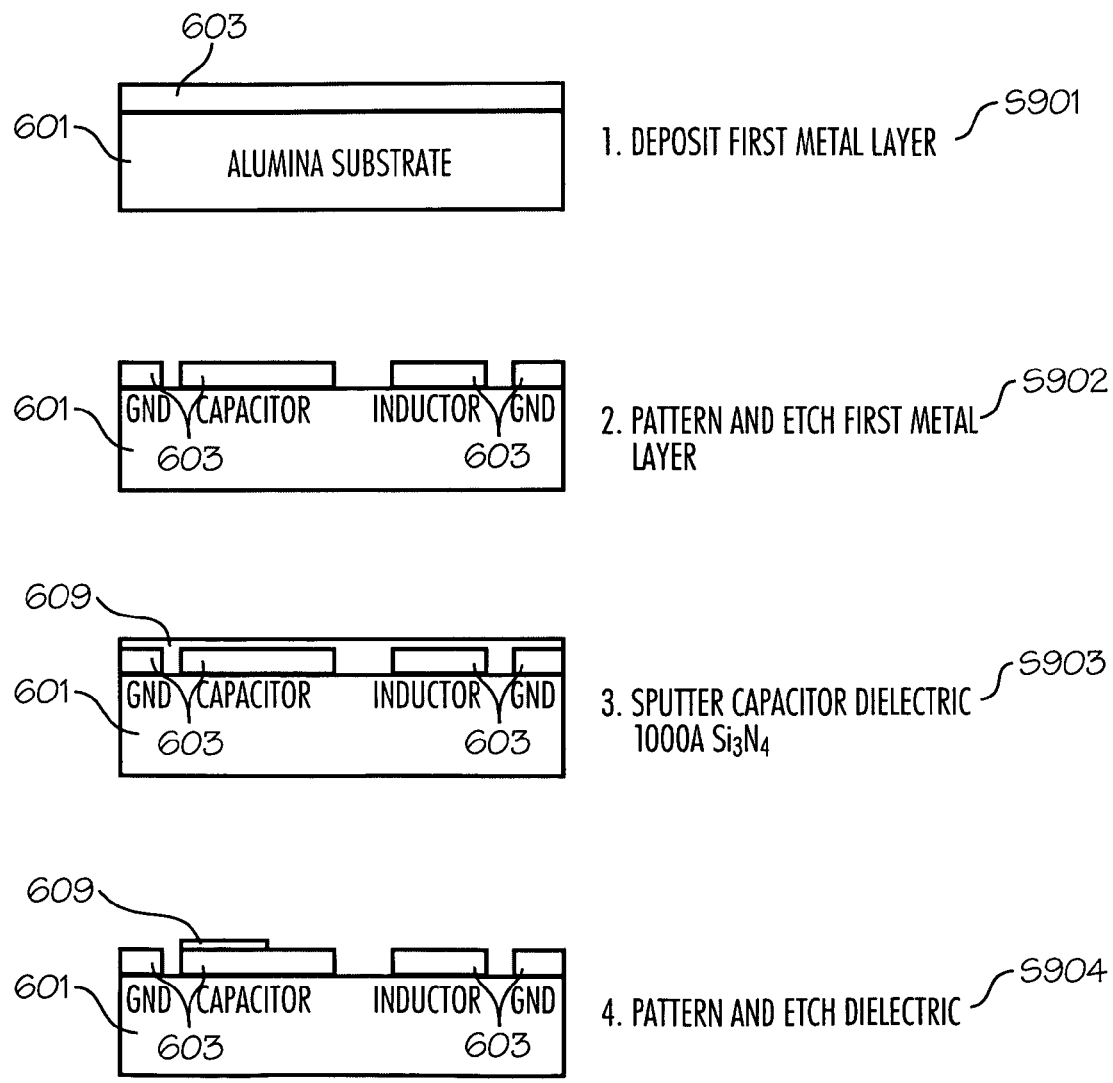
FIGS. 9A, 9B and 9C depict a method for manufacture of a bandpass filter with inductors on a top metal layer according to one embodiment of the invention.
Figure 9B:
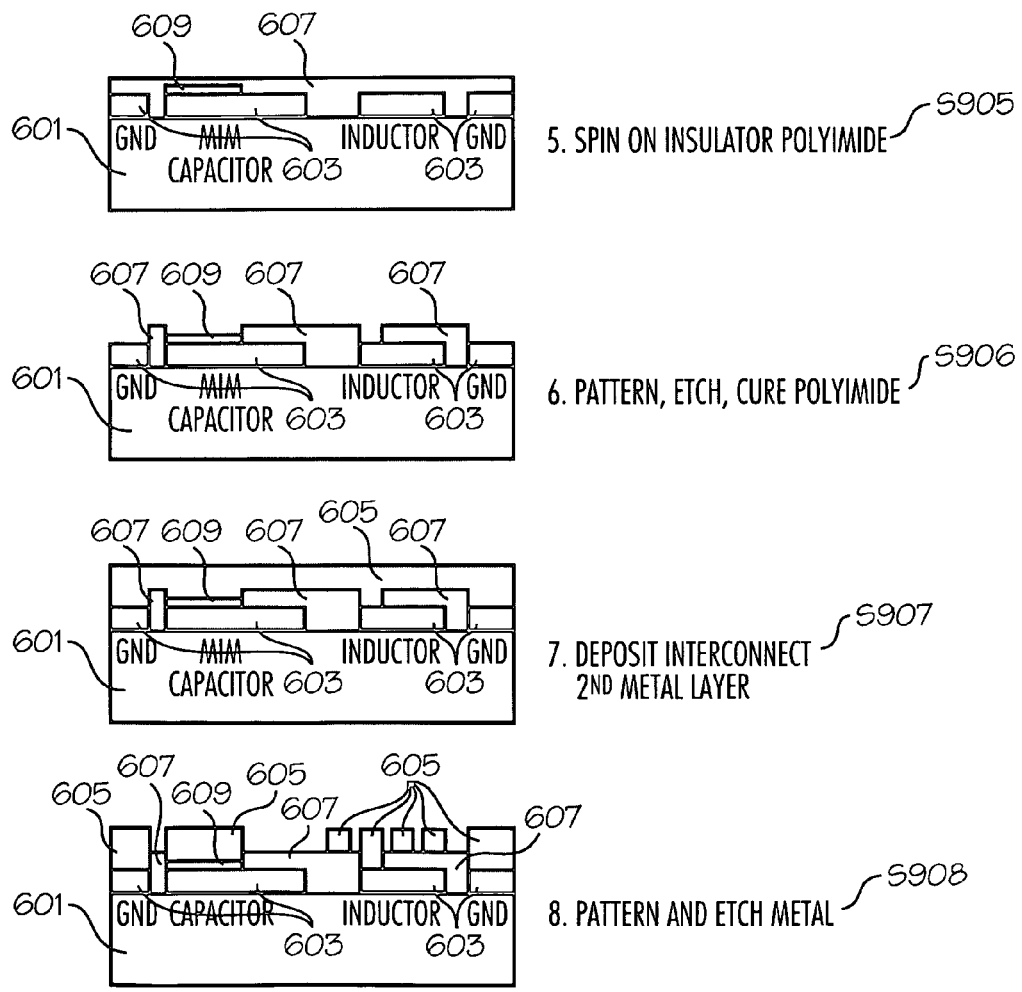
Figure 9C:
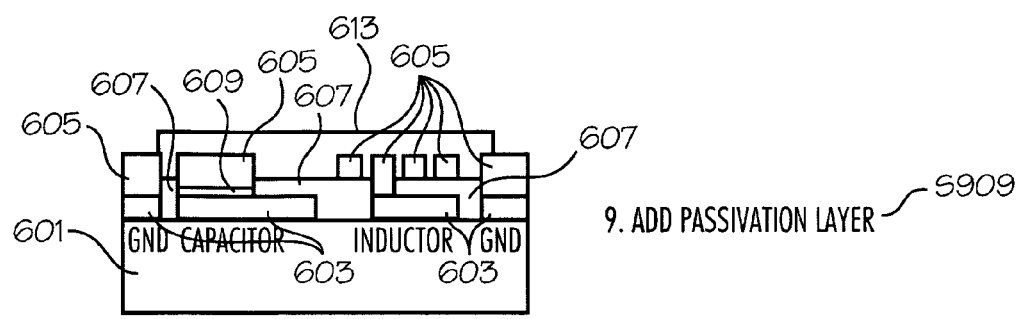
Figure 9C:
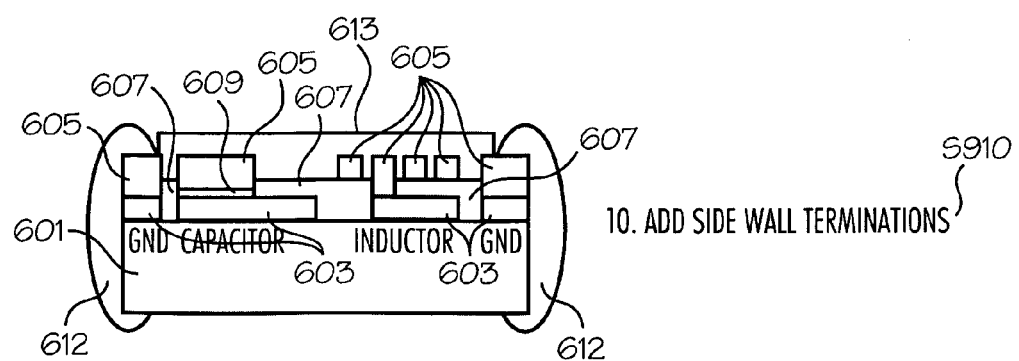

FIGS. 9A-C show a method of manufacture identical to that in FIGS. 8A-C except that the representative bandpass filter has a different pattern layout in which inductors are on a top layer.

The layouts shown in FIGS. 1 to 3 are in no way limiting with regards to the shape and size of metal regions that may be used to create a bandpass filter according to the invention. The following figures show a few possible alternatives.

Figure 10:
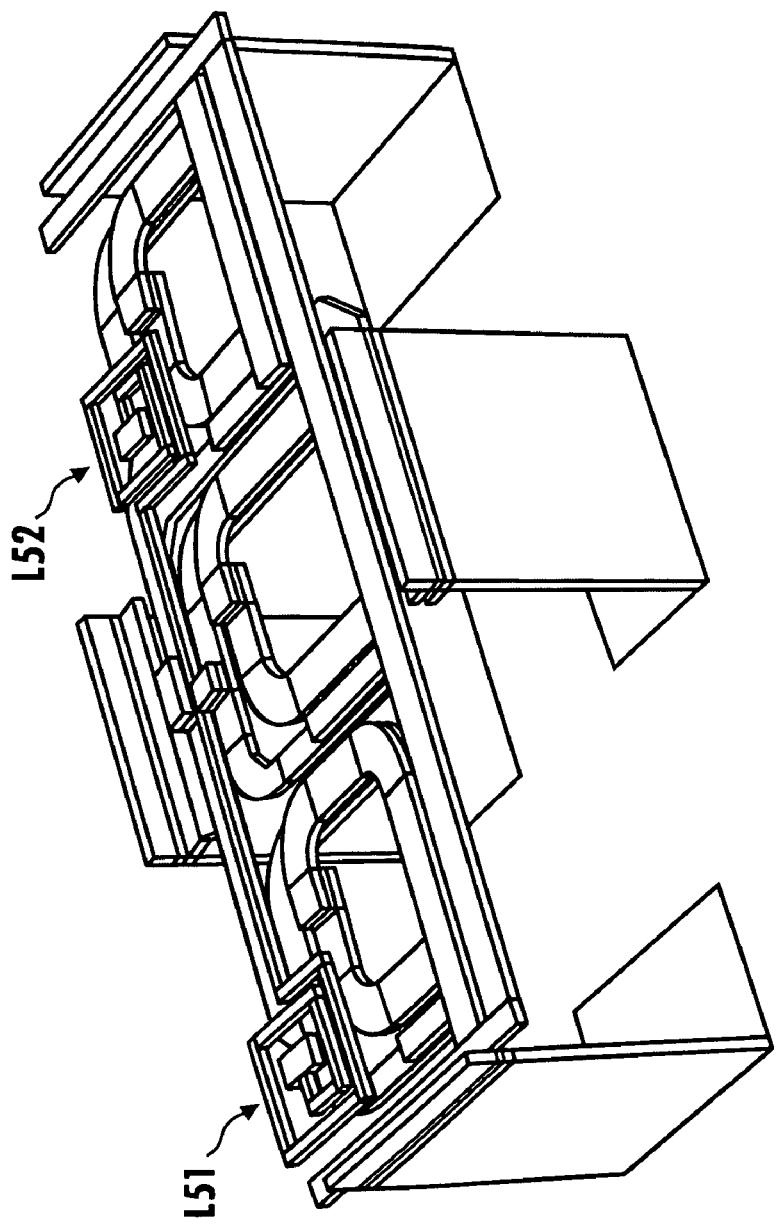
FIG. 10 depicts an isometric view of a physical layout of a bandpass filter with coiled inductors in a coupling network according to one embodiment of the invention.

For example, FIG. 10 depicts an isometric view of a physical layout of a bandpass filter with coiled inductors in the coupling network. Since the coupling network 140 is positioned in a region other than the region the resonators are located, the invention provides for more flexibility in altering the layout of each region to achieve different frequency responses in the filter. In particular, inductors L51 and L52 may be implemented as coiled inductors rather than straight line inductors as shown in FIGS. 1 to 3. By using coils for inductors L51 and L52, inductance for these two inductors can be increased. The out-band performance at the higher passband of the frequency response (e.g., 5 GHz to 8 GHz in FIG. 5) may be improved.

Figure 11:
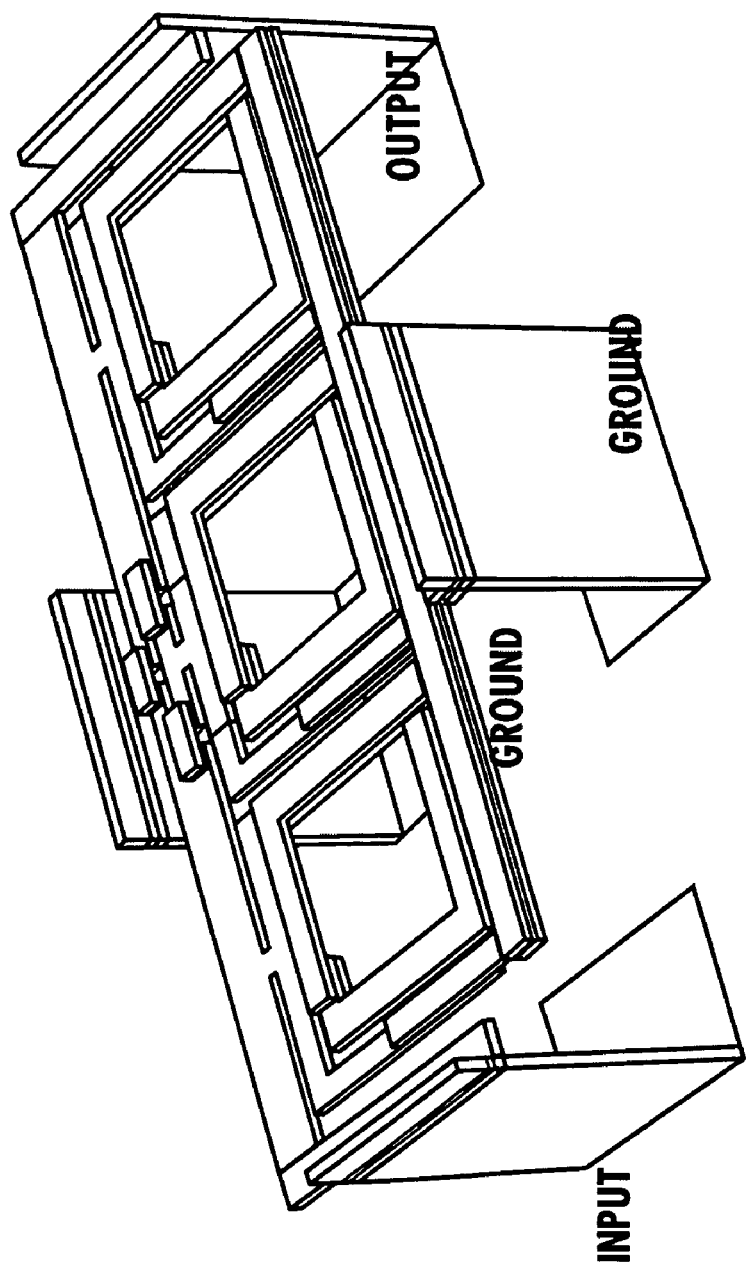
FIG. 11 depicts an isometric view of a physical layout of a bandpass filter with rectangular-shaped inductor coils according to one embodiment of the invention.
Figure 13:
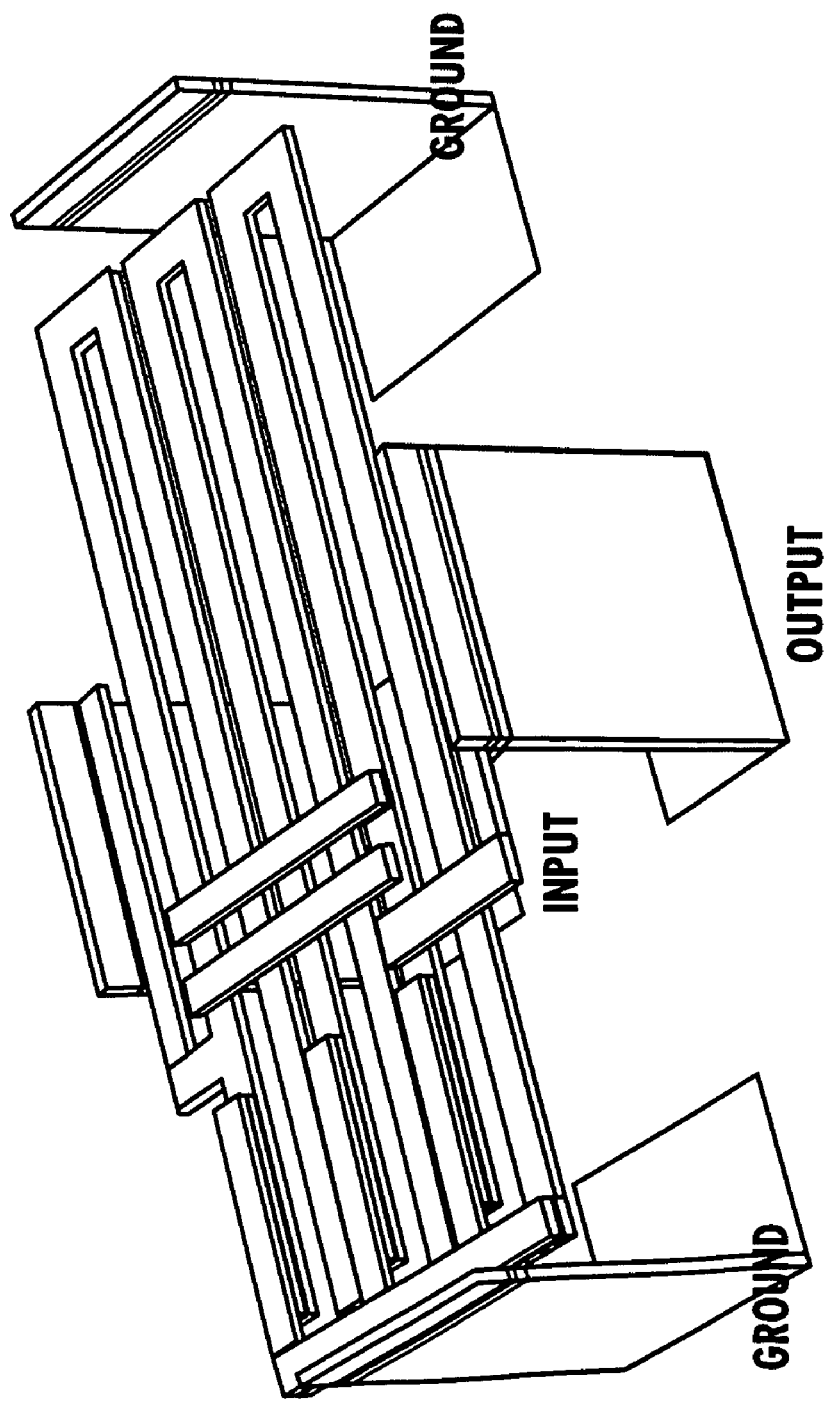
FIG. 13 depicts an isometric view of a physical layout of a bandpass filter hairpin-shaped inductors according to one embodiment of the invention.

FIG. 1 shows a bandpass filter embodiment where the inductor coils of the LC resonators 130 are rectangular with rounded corners. However, different shapes for the coil inductors of the LC resonators 130 may also be used. For example, FIG. 11 depicts an isometric view of a physical layout of a bandpass filter with rectangular-shaped inductor coils. Rather than rounded corners, these coils have square corners. As another example, rather than a generally symmetric coil as shown in FIG. 1 and FIG. 11, FIG. 13 depicts an isometric view of a physical layout of a bandpass filter hairpin-shaped inductors. Other shapes of inductors are also possible, including triangular, elliptical, round, or polygonal.

Figure 12:
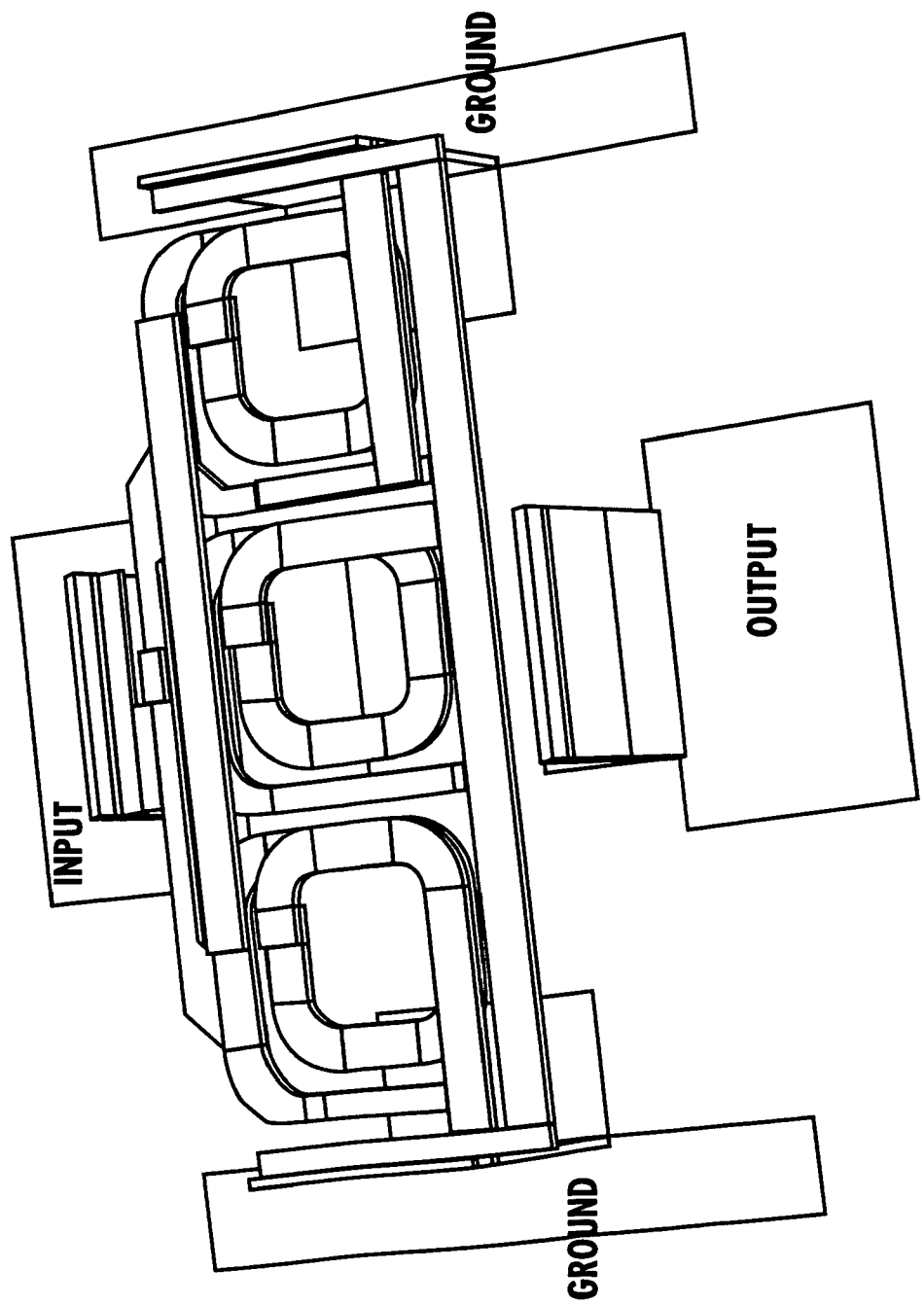
FIG. 12 depicts an isometric view of a physical layout of a bandpass filter with input and output terminals on the longer side of the filter package according to one embodiment of the invention.

Furthermore, the package layout of the bandpass filter of the invention is not limited to that as shown in FIG. 1. Input, output, and ground terminals may be positioned in any manner. As one example, FIG. 12 depicts an isometric view of a physical layout of a bandpass filter with input and output terminals on the longer side of the filter package, rather than on the shorter side as shown in FIG. 1. Likewise, the ground terminals have been flipped to the shorter side.

Other embodiments of the invention will be apparent to those skilled in the art from consideration of the specification and embodiments disclosed herein. Thus, the specification and examples are exemplary only, with the true scope and spirit of the invention set forth in the following claims and legal equivalents thereof.

What is claimed is:

1. A bandpass filter comprising:
   two thin-film metal layers, each metal layer having a first region and a second region;
   three LC resonators, the three LC resonators contained within the first region of the two thin-film metal layers, wherein each of the three LC resonators include a capacitor and an inductor, the inductors each comprising a natural coiling direction, the capacitors being positioned in the natural coiling direction of their respective inductors in each LC resonator; and
   one or more coupling networks for connecting the three LC resonators in parallel, the one or more coupling networks contained in the second region of the two thin-film metal layers.

2. A bandpass filter comprising:
   one or more metal layers, each metal layer having a first region and a second region;
   two or more LC resonators, the two or more LC resonators contained within the first region of the one or more metal layers, wherein each of the two or more LC resonators include a capacitor and an inductor, the inductors each comprising a natural coiling direction, the capacitors being positioned in the natural coiling direction of their respective inductors in each LC resonator;
   one or more coupling networks for connecting the two or more LC resonators in parallel, the one or more coupling networks contained in the second region of the one or more metal layers;
   an input terminal and an output terminal, the input terminal and output terminal being positioned on opposite sides of a package that contains the bandpass filter; and
   two or more ground electrodes including a first and second ground electrode, the first and second ground electrodes being positioned on opposites sides of the package that contains the bandpass filter.

3. The bandpass filter of claim 2 comprising two thin-film metal layers and three LC resonators.

4. The bandpass filter of claim 2 wherein each of the two or more LC resonators includes an inductor, and each inductor of the two or more LC resonators has the same coiling direction.

5. The bandpass filter of claim 2 wherein the two or more LC resonators and the one or more coupling networks are constructed on one side of a substrate.

6. The bandpass filter of claim 2 wherein the one or more coupling networks include coil inductors.

7. The bandpass filter of claim 2 wherein each the two or more LC resonators includes an inductor, and each inductor of the two or more LC resonators is in the shape of a rounded rectangular coil.

8. The bandpass filter of claim 2 wherein each the two or more LC resonators includes an inductor, and each inductor of the two or more LC resonators is in the shape of a rectangular coil.

9. The bandpass filter of claim 2 wherein the first region and the second region do not overlap each other.

10. A bandpass filter comprising:
    a first thin-film layer and a second thin-film metal layer, each metal layer having a first region and a second region, wherein the first region and the second region do not overlap;
    a first, second, and third LC resonator, wherein each LC resonator is contained within the first region of the first and second thin-film metal layers, wherein each LC resonator includes a capacitor and an inductor, the inductors each comprising a natural coiling direction, the capacitors being positioned in the natural coiling direction of their respective inductors in each LC resonator, and each inductor has the same coiling direction;
    a coupling network for connecting the three LC resonators in parallel, the coupling network contained in the second region of the first and second thin-film metal layers;
    an input terminal connected to the first LC resonator and an output terminal connected to the third LC resonator, the input terminal and output terminal being positioned on opposite sides of a package that contains the bandpass filter; and
    a first and second ground electrode positioned on opposites sides of the package that contains the bandpass filter.

* * * * *